US009401719B2

(12) United States Patent
Lesbats et al.

(10) Patent No.: US 9,401,719 B2
(45) Date of Patent: Jul. 26, 2016

(54) OSCILLATOR CIRCUIT AND METHOD OF PROVIDING TEMPERATURE COMPENSATION THEREFOR

(71) Applicants: Mathieu Gauthier Lesbats, Munich (DE); Hubert Martin Bode, Haar (DE); Florian Frank Ebert, Munich (DE)

(72) Inventors: Mathieu Gauthier Lesbats, Munich (DE); Hubert Martin Bode, Haar (DE); Florian Frank Ebert, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/459,401

(22) Filed: Aug. 14, 2014

(65) Prior Publication Data

US 2016/0049905 A1 Feb. 18, 2016

(51) Int. Cl.
*H03L 1/00* (2006.01)
*H03L 1/02* (2006.01)

(52) U.S. Cl.
CPC . *H03L 1/00* (2013.01); *H03L 1/022* (2013.01)

(58) Field of Classification Search
CPC ........ H03K 3/36; H03K 3/011; H03K 3/0231
USPC ........................................... 331/66, 143, 153
See application file for complete search history.

(56) References Cited

U.S. PATENT DOCUMENTS 7,102,452 B1 * 9/2006 Holmes ......................... 331/111
7,432,771 B2 * 10/2008 Chui ............................ 331/144
7,884,679 B2 2/2011 Mahooti
8,475,038 B2 7/2013 Kim
8,508,307 B2 * 8/2013 Mitsuda et al. ............... 331/176
2003/0231021 A1 12/2003 Alwardi et al.
2007/0241833 A1 * 10/2007 Nervegna ...................... 331/176
2008/0061899 A1 3/2008 Stolpman
2011/0187422 A1 8/2011 Hammes et al.
2013/0093522 A1 * 4/2013 Pedersen ............ H03K 3/02315 331/34

* cited by examiner

*Primary Examiner* — Jeffrey Shin

(57) ABSTRACT

An oscillator circuit comprising at least a first component arranged to be statically calibrated to calibrate the oscillator circuit to achieve a symmetrical frequency/temperature profile for the oscillator circuit. The oscillator circuit further comprises at least one further component arranged to be dynamically calibrated to enable an oscillating frequency of the oscillator circuit to be dynamically adjusted, and at least one temperature compensation component arranged to receive at least one temperature indication for the oscillator circuit and to dynamically adjust the at least one further component based at least partly on the at least one received temperature indication. In some examples, the at least one temperature compensation component is arranged to dynamically adjust the at least one further component based on a standardized temperature compensation scheme.

20 Claims, 9 Drawing Sheets

OSCILLATOR CIRCUIT AND METHOD OF PROVIDING TEMPERATURE COMPENSATION THEREFOR

FIELD OF THE INVENTION

This invention relates to an oscillator circuit and a method of providing temperature compensation therefor.

BACKGROUND OF THE INVENTION

In the field of integrated circuit (IC) devices, there is a customer driven motivation to remove quartz and resonator components from application boards in order to reduce space and cost, and to replace them with embedded RC oscillators. For low cost applications such as Local Interconnect Network (LIN) applications, conventional embedded RC oscillator implementations have been able to provide sufficiently stable performance over temperature variations to fulfil the less stringent requirements of such low cost applications. However, there is increasing motivation to use embedded RC oscillators within applications such as CAN (controller area network) applications. Therefore, the embedded RC oscillators must be stable enough over temperature to fulfil the stringent maximum bit rate deviation allowed by, for example, the CAN protocol.

There are various different ways to calibrate an embedded RC oscillator in production. To achieve a high stability of the output frequency across the whole temperature range, temperature compensation schemes must be used. Some of them require more time and memory resources than others. In order to minimise costs, die size and power consumption there is a continuous need for temperature compensation schemes that reduce the required memory resources whilst maintaining the stability of the output frequency for the embedded RC oscillators over required temperature ranges.

SUMMARY OF THE INVENTION

The present invention provides an oscillator circuit and a method of providing temperature compensation for an output frequency of an embedded oscillator circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
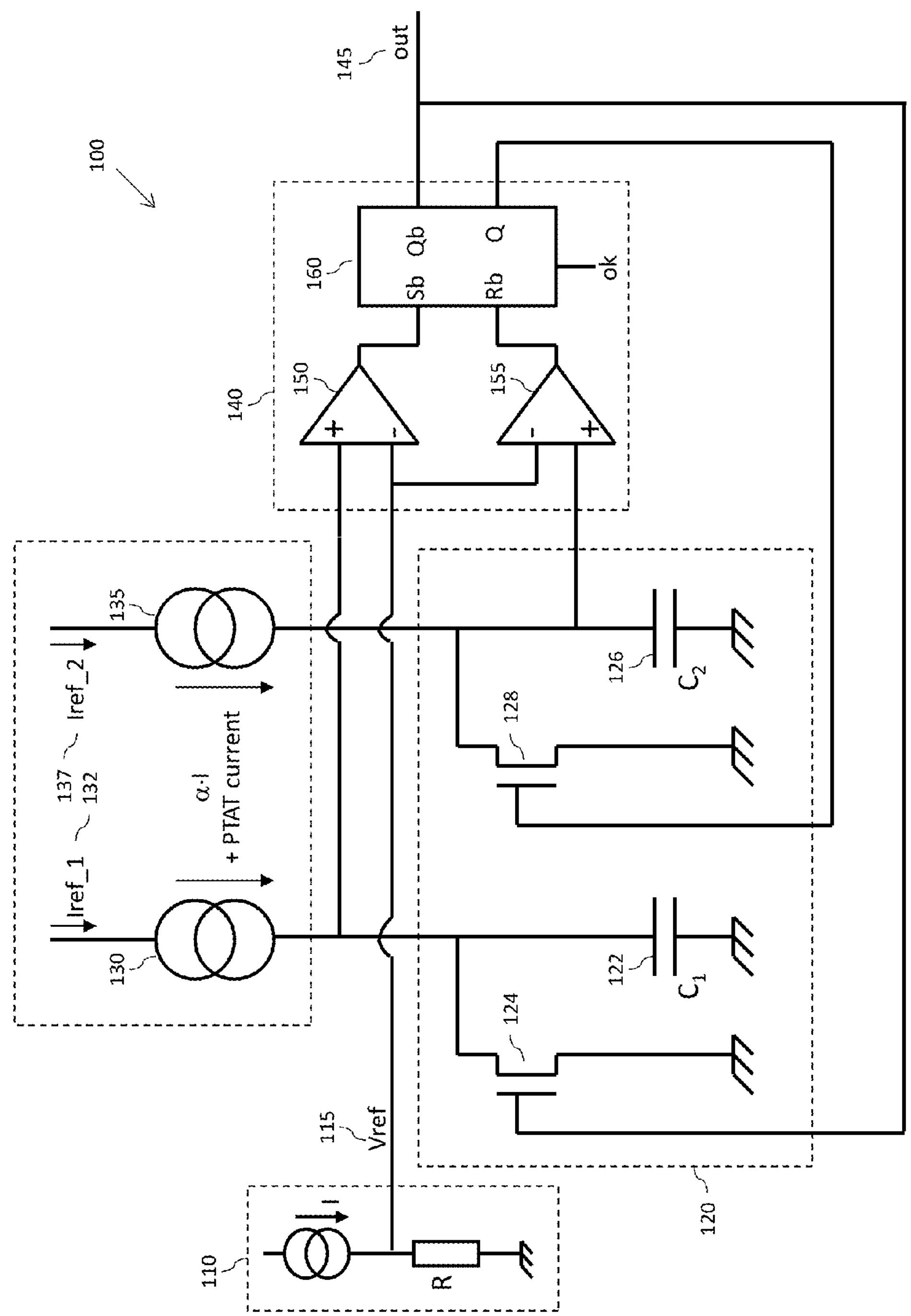
FIG. 1 illustrates a simplified circuit diagram of an example of an oscillator circuit.

The present invention will now be described with reference to the accompanying drawings. However, it will be appreciated that the present invention is not limited to the specific examples herein described and as illustrated in the accompanying drawings. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

According to some examples of a first aspect of the present invention, there is provided an oscillator circuit comprising at least a first component arranged to be statically calibrated to calibrate the oscillator circuit to achieve a symmetrical frequency/temperature profile for the oscillator circuit, at least one further component arranged to be dynamically calibrated to enable an oscillating frequency of the oscillator circuit to be dynamically adjusted, and at least one temperature compensation component arranged to receive at least one temperature indication for the oscillator circuit and to dynamically adjust the at least one further component based at least partly on the at least one received temperature indication.

In this manner, such static calibration to achieve a substantially symmetrical frequency/temperature profile for the oscillator circuit results in oscillator circuits within all production parts having substantially the same frequency/temperature profile (within an acceptable tolerance). As a result, a standardized dynamic temperature compensation scheme may subsequently be implemented for the oscillator circuits within all production parts to maintain the stability of the output frequency for embedded oscillator circuits over required temperature ranges without any need to store a part-specific table containing temperature compensation data. Advantageously, by removing the need to store part-specific tables, the need to provide memory within which to store the tables is also removed, reducing the die area required to implement the dynamic compensation scheme compared to conventional techniques, as well as helping to reduce cost and power consumption. Furthermore, the use of a standardized dynamic temperature compensation scheme to be implemented for the oscillator circuits within all production parts, as opposed to part-specific schemes used in conventional techniques, a simplified dynamic temperature compensation implementation may be provided, reducing costs etc. as well as test times since there is no need for such part-specific tables to be populated during production testing.

In some optional embodiments, the at least first component may be arranged to be statically calibrated to calibrate the oscillator circuit to achieve a symmetrical parabolic frequency/temperature profile for the oscillator circuit.

In some optional embodiments, the at least first component may comprise at least one current source for generating at least a part of a charging current for charging at least one capacitive element within an RC network of the oscillator circuit.

In some optional embodiments, the at least first component may comprise a current source component arranged to provide a Proportional To Absolute Temperature, PTAT, current component of the charging current.

In some optional embodiments, the at least first component may be statically calibrated to equalise oscillating frequencies of the oscillator circuit at extreme temperatures within a temperature range.

In some optional embodiments, the at least one further component arranged to be dynamically calibrated may comprise at least one capacitive element within an RC network of the oscillator circuit.

In some optional embodiments, the oscillator circuit may be implemented within an integrated circuit device comprising at least one die within a single integrated circuit package.

According to some example embodiments of a second aspect of the present invention, there is provided a method of providing temperature compensation for an output frequency of an embedded oscillator circuit. The method comprises statically calibrating the oscillator circuit to achieve a symmetrical frequency/temperature profile therefor, and enabling dynamic temperature compensation of the oscillator circuit based on a standardized temperature compensation scheme.

In some optional embodiments, the method may comprise statically calibrating the oscillator circuit to achieve a symmetrical parabolic frequency/temperature profile for the oscillator circuit.

Referring now to FIG. 1, there is illustrated a simplified circuit diagram of an example of an oscillator circuit 100. The oscillator circuit 100 comprises a reference voltage generator component 110 arranged to generate a reference voltage Vref 115. In the illustrated example, the reference voltage generator component 110 has been illustrated as comprising a current source and a resistance for converting the current output by the current source into the reference voltage 115. However, it will be appreciated that any form of voltage generator circuit may be used to implement the reference voltage generator component 110, for example such as a band gap circuit or the like.

The oscillator circuit 100 further comprises an RC (resistance-capacitance) network sub-section 120. The RC network sub-section 120 comprises a first capacitive element 122 arrange to receive, and thereby be charged by, a first charging current Iref_1 132 from a first current source 130. The RC network sub-section 120 further comprises a first switching component 124 controllable to discharge the first capacitive element 122 there through. Additionally, the RC network sub-section 120 comprises a second capacitive element 126 arrange to receive, and thereby be charged by, a second charging current Iref_2 137 from a second current source 135. The RC network sub-section 120 further comprises a second switching component 128 controllable to discharge the second capacitive element 126 there through.

The oscillator circuit 100 further comprises an oscillator sub-section 140 arranged to generate an oscillating output 145. The oscillator sub-section 140 comprises a first comparator 150. A non-inverting input of the first comparator 150 is operably coupled between the first capacitive element 122 and the first current source 130. An inverting input of the first comparator 150 is operably coupled to the output of the reference voltage generator component 110. In the illustrated example, the first comparator 150 comprises an inverting output. In this manner, the first comparator 150 is arranged to compare the voltage across the first capacitive element 122 to the reference voltage 115, and to output a logical '0' value if the voltage across the first capacitive element 122 is greater than the reference voltage 115 and a logical '1' value if the voltage across the first capacitive element 122 is less than the reference voltage 115.

The oscillator sub-section 140 further comprises a second comparator 155. A non-inverting input of the second comparator 155 is operably coupled between the second capacitive element 126 and the second current source 135. An inverting input of the second comparator 155 is operably coupled to the output of the reference voltage generator component 110. In the illustrated example, the second comparator 155 also comprises an inverting output. In this manner, the second comparator 155 is arranged to compare the voltage across the second capacitive element 122 to the reference voltage 115, and to output a logical '0' value if the voltage across the second capacitive element 126 is greater than the reference voltage 115 and a logical '1' value if the voltage across the second capacitive element 126 is less than the reference voltage 115.

The oscillator sub-section 140 further comprises an S/R flip-flop 160. A first (set) input of the S/R flip-flop 160 is operably coupled to the output of the first comparator 150. A second (reset) input of the S/R flip-flop 160 is operably coupled to the output of the second comparator 155. In the illustrated example, the S/R flip-flop 160 comprises active low inputs. In this manner, upon a logical '0' value being received at the first (set) input thereof, the S/R flip-flop 160 is arranged to apply a logical '1' at an output Q thereof, and a logical '0' at a complimentary output Qb thereof. Conversely, upon a logical '0' value being received at the second (reset) input of the S/R flip-flop 160, the S/R flip-flop 160 is arranged to apply a logical '0' at the output Q thereof, and a logical '1' at the complimentary output Qb thereof. The complimentary output Qb of the S/R flip-flop 160 is operably coupled to the first switching element 124 and arranged to control the first switching element 124 to discharge the first capacitive element 122 when a logical '1' is applied to the complimentary output Qb of the S/R flip-flop 160. Similarly, the output Q of the S/R flip-flop 160 is operably coupled to the second switching element 128 and arranged to control the second switching element 128 to discharge the second capacitive element 126 when a logical '1' is applied to the output Q of the S/R flip-flop 160. In this manner, the switching elements 124, 128 are caused to charge and discharge their respective capacitive elements 122, 126 in an opposing manner, triggering the comparators 150, 155 to output signals that toggle the S/R flip-flop 160 in an oscillating manner. The oscillating frequency of the oscillator circuit 100 is dependent on the rates at which the capacitive elements 122, 126 are charged and discharged and the reference voltage 115. The rates at which the capacitive elements 122, 126 are charged and discharged are proportional to the reference voltage Vref 115, the capacitive values of the capacitive elements 122, 126, the resistive characteristics of the switching elements 124, 128 when switched on, and the charging currents 132, 137.

In order to ensure the accuracy of the oscillator circuit 100, it is proposed to perform trimming during production to compensate for variations between individual devices. In accordance with some examples of the present invention it is proposed to perform static calibration of the oscillator circuit 100 in order to achieve a substantially symmetrical frequency/temperature profile for the oscillator circuit 100. As explained in greater detail below, the inventors have identified that such static calibration to achieve a substantially symmetrical frequency/temperature profile for the oscillator circuit 100 results in oscillator circuits within all production parts having substantially the same frequency/temperature profile (within an acceptable tolerance). As a result, a standardized dynamic temperature compensation scheme may subsequently be implemented for the oscillator circuits within all production parts to maintain the stability of the output frequency for embedded oscillator circuits over required temperature ranges without any need to store a part-specific table containing temperature compensation data. Advantageously, by removing the need to store part-specific tables, the need to provide memory within which to store the tables is also removed, reducing the die area required to implement the dynamic compensation scheme compared to conventional techniques, as well as helping to reduce cost and power consumption. Furthermore, the use of a standardized dynamic temperature compensation scheme to be implemented for the oscillator circuits 100 within all production parts, as opposed to part-specific schemes used in conventional techniques, a simplified dynamic temperature compensation implementation may be provided, reducing costs etc. as well as test times since there is no need for such part-specific tables to be populated during production testing.

Figure 2:
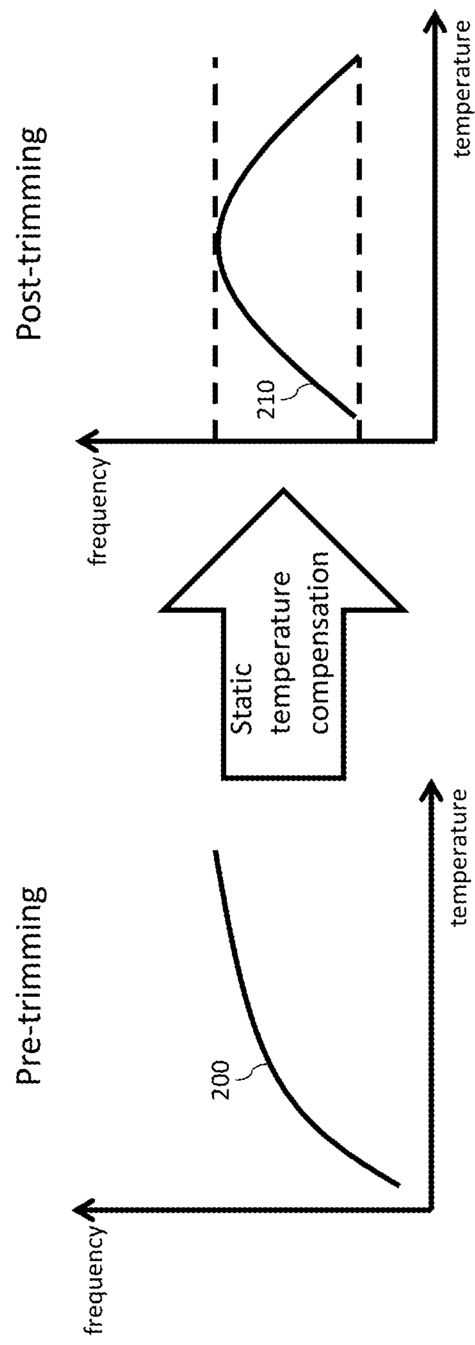
FIG. 2 illustrates simplified graphs of an example of frequency over temperature for the oscillator circuit of FIG. 1.

FIG. 2 illustrates simplified graphs of an example of frequency over temperature for the oscillator circuit 100 before and after static calibration has been performed in order to achieve a substantially symmetrical frequency/temperature profile for the oscillator circuit 100. A first plot 200 of FIG. 2 illustrates a simplified example of the frequency/temperature profile for the oscillator circuit 100 before any calibration has been performed. As previously mentioned, it is proposed to perform static calibration of the oscillator circuit 100 in order to achieve a substantially symmetrical frequency/temperature profile for the oscillator circuit 100. A second plot 210 of FIG. 2 illustrates a simplified example of the frequency/temperature profile for the oscillator circuit 100 after such static compensation has been performed. In order to achieve a substantially symmetrical frequency/temperature profile for the oscillator circuit 100 comprising the flattest possible curve, it is proposed to trim the oscillator circuit 100 to equalise the oscillating frequencies of the oscillator circuit 100 at extreme (hot and cold) temperatures within a particular temperature range, such as a required operating temperature range for the oscillator circuit 100. As illustrated by the second plot 210 of FIG. 2, having trimmed the oscillator circuit 100 to equalise the oscillating frequencies of the oscillator circuit 100 at extreme (hot and cold) temperatures, the oscillator circuit 100 comprises a substantially symmetrical parabolic frequency/temperature profile.

Such static calibration of the oscillator circuit 100 to achieve a substantially symmetrical frequency/temperature profile therefor may be implemented in any suitable manner. For example, the charging currents 132, 137 used to charge the capacitive elements 122, 126 may comprise a PTAT (Proportional To Absolute Temperature) current component added to a main charging current $\alpha \cdot I$. By changing the size of the PTAT current component within the charging currents 132, 137 relative to the main charging current $\alpha \cdot I$, the temperature coefficient of the charging currents 132, 137 may be changed, thereby allowing the frequency/temperature profile for the oscillator circuit 100 to be trimmed.

Figure 3:
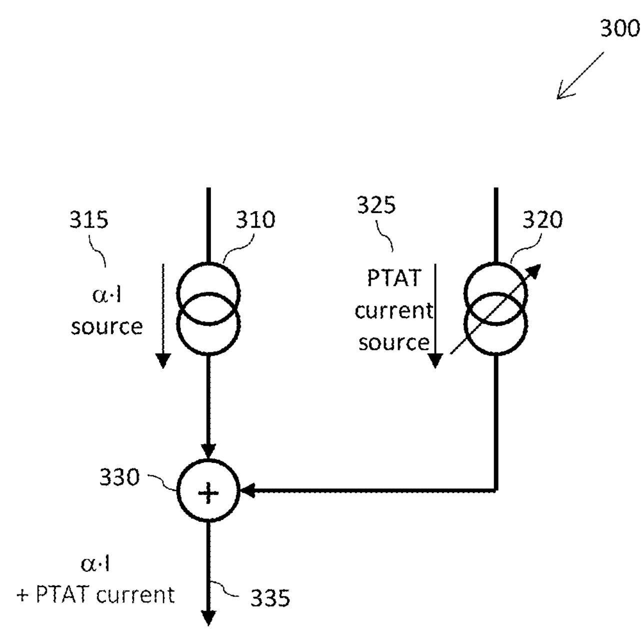
FIG. 3 illustrates a simplified diagram of an example of a current source.

FIG. 3 illustrates a simplified diagram of an example of a current source 300 such as may be used to implement the current sources 130, 135 of FIG. 1. In the illustrated example, the current source 300 comprises a first current source component 310 arranged to provide a main charging current $\alpha \cdot I$ component 315. The current source 300 illustrated in FIG. 3 further comprises a second current source component 320 arranged to provide a PTAT current component 325. In some examples, the second current source component 320 may comprise a bandgap circuit for generating the PTAT current 325. The main charging current ad component 315 and the PTAT current component 325 are combined, at 330, to produce a charging current 335, for example which may form one of the charging currents 132, 137 within the oscillator circuit 100 of FIG. 1. The second current source component 320 is capable of being statically calibrated to adjust the PTAT current component 325 within the charging current 335 output by the current source 300. For example, the second current source component 320 may comprise a trimmable resistive network capable of being statically trimmed to adjust the PTAT current component output thereby. In this manner, the current source 300 is capable of being calibrated (by way of the second current source component 320) to calibrate a temperature coefficient of the charging current 335 output thereby.

Accordingly, in the example illustrated in FIG. 1, by calibrating a characteristic of oscillator circuit 100 such as the temperature coefficient of the charging currents 132, 137, the frequency/temperature profile for the oscillator circuit 100 may be calibrated, for example to achieve a substantially symmetrical profile.

It will be appreciated that the present invention is not limited to the static calibration of the oscillator circuit 100 being implemented by way of statically trimming a current source to adjust the PTAT current component of a charging current for the capacitive components within the RC network of the oscillator circuit, and it is contemplated that other techniques for statically calibrating the oscillator circuit 100 to achieve a substantially symmetrical frequency/temperature profile for the oscillator circuit 100 may alternatively be implemented. One such alternative technique may comprise, say, adding a portion of PTAT current into the resistor network generating the reference voltage Vref 115.

Figure 4:
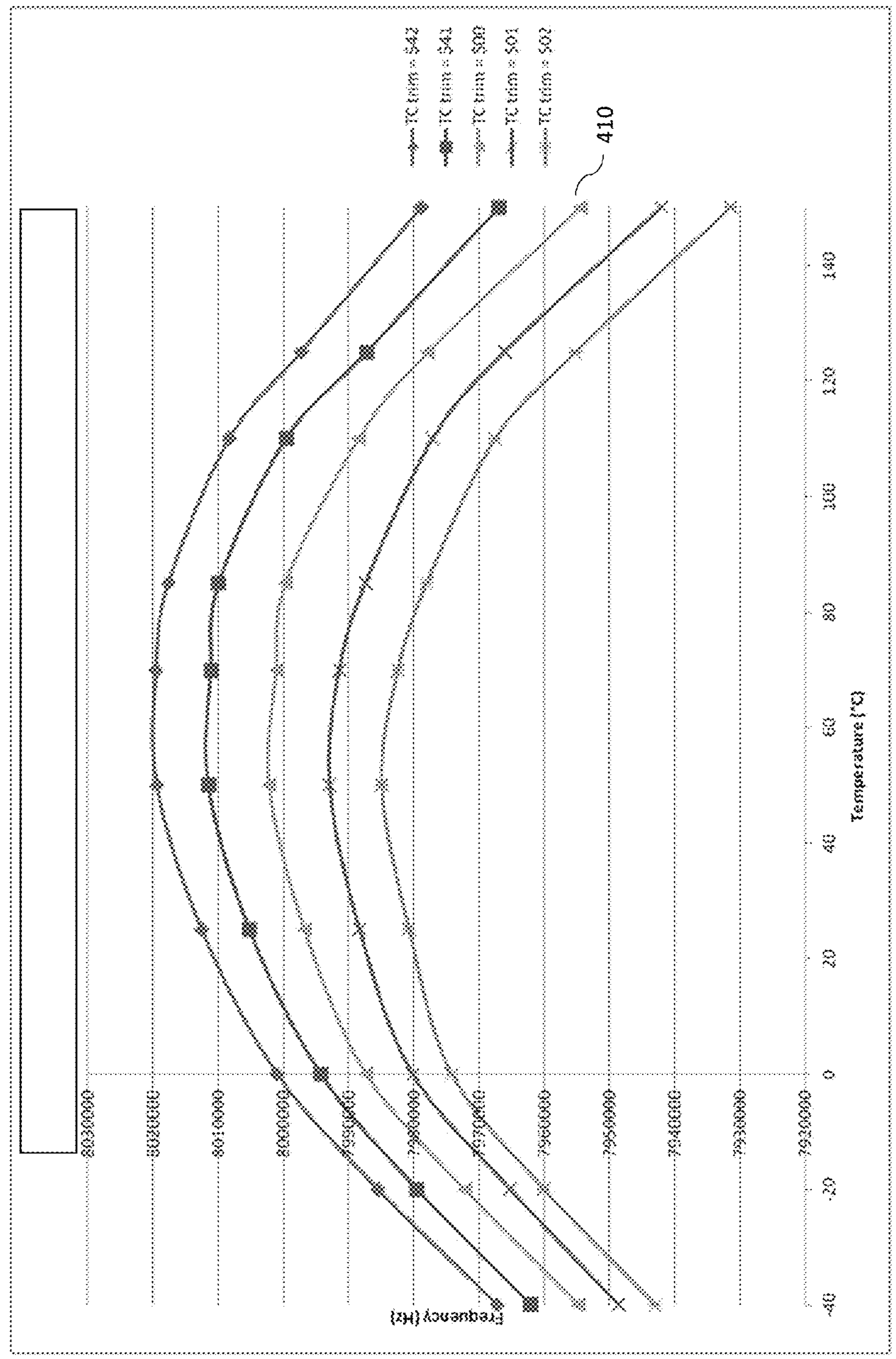
FIG. 4 illustrates a simplified graph showing frequency over temperature for an example of the oscillator circuit in different static calibration states.

As previously mentioned, the inventors have identified that static calibration to achieve a substantially symmetrical frequency/temperature profile for the oscillator circuit 100, such as described above, results in oscillator circuits within all production parts having substantially the same frequency/temperature profile (within an acceptable tolerance). FIG. 4 illustrates a simplified graph showing frequency over temperature for an example of the oscillator circuit 100 in different static calibration states. In the example illustrated in FIG. 4, the oscillator circuit 100 comprises current sources 130, 135 comprising PTAT current source components 320 capable of being calibrated (trimmed) with a granularity of 0.1% (or +/−0.5%). Five plots are illustrated in FIG. 4 representing five static calibration settings. As illustrated in FIG. 4, the temperature coefficient of the oscillator circuit 100 is affected by changing the static calibration therefor such that each calibration setting results in a different frequency/temperature profile for the oscillator circuit 100. Notably, the effect on the temperature coefficient of the oscillator circuit by the static calibration is non-linear. As such, changes in the oscillating frequency of the oscillator circuit 100 affected by the static calibration at a low temperature differ in magnitude as compared with the changes in the oscillating frequency of the oscillator circuit 100 affected by the static calibration at a high temperature. This unequal effect at different temperature extremes on the changes in the oscillating frequency of the oscillator circuit 100 affected by the static calibration enables a substantially symmetrical frequency/temperature profile for the oscillator circuit 100 to be achieved such that the oscillating frequencies of the oscillator circuit 100 at extreme temperatures within a temperature range are approximately equalised. For example, the static calibration state represented by the plot 410 in FIG. 4 achieves such a substantially symmetrical frequency/temperature profile for the oscillator circuit 100, whereby the oscillating frequencies of the oscillator circuit 100 at extreme temperatures within a temperature range are approximately equalised.

Figure 5:
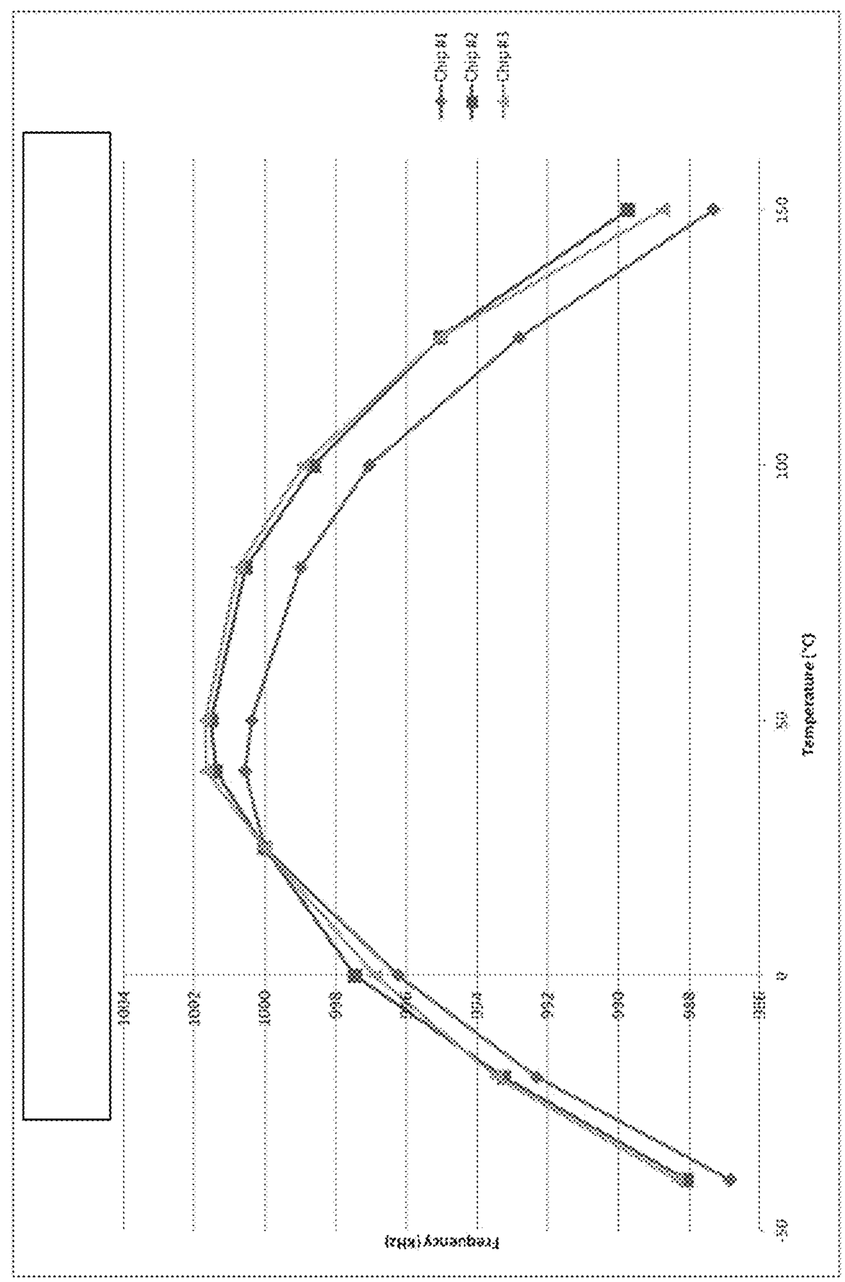
FIG. 5 illustrates an example of the frequency/temperature profiles for oscillator circuits within multiple different integrated circuit devices calibrated to 1 MHz at room temperature.

With current semiconductor fabrication technology, oscillator circuits have relatively similar frequency/temperature profiles. FIG. 5 illustrates an example of the frequency/temperature profiles for oscillator circuits 100 within multiple different integrated circuit devices that have been calibrated to 1 MHz at room temperature (a conventional approach to static oscillator circuit calibration). However, such frequency/temperature profiles are not similar enough to achieve a sufficiently stable oscillating frequency over temperature to fulfil the stringent maximum bit rate deviation allowed by, for example, the CAN protocol.

Figure 6:
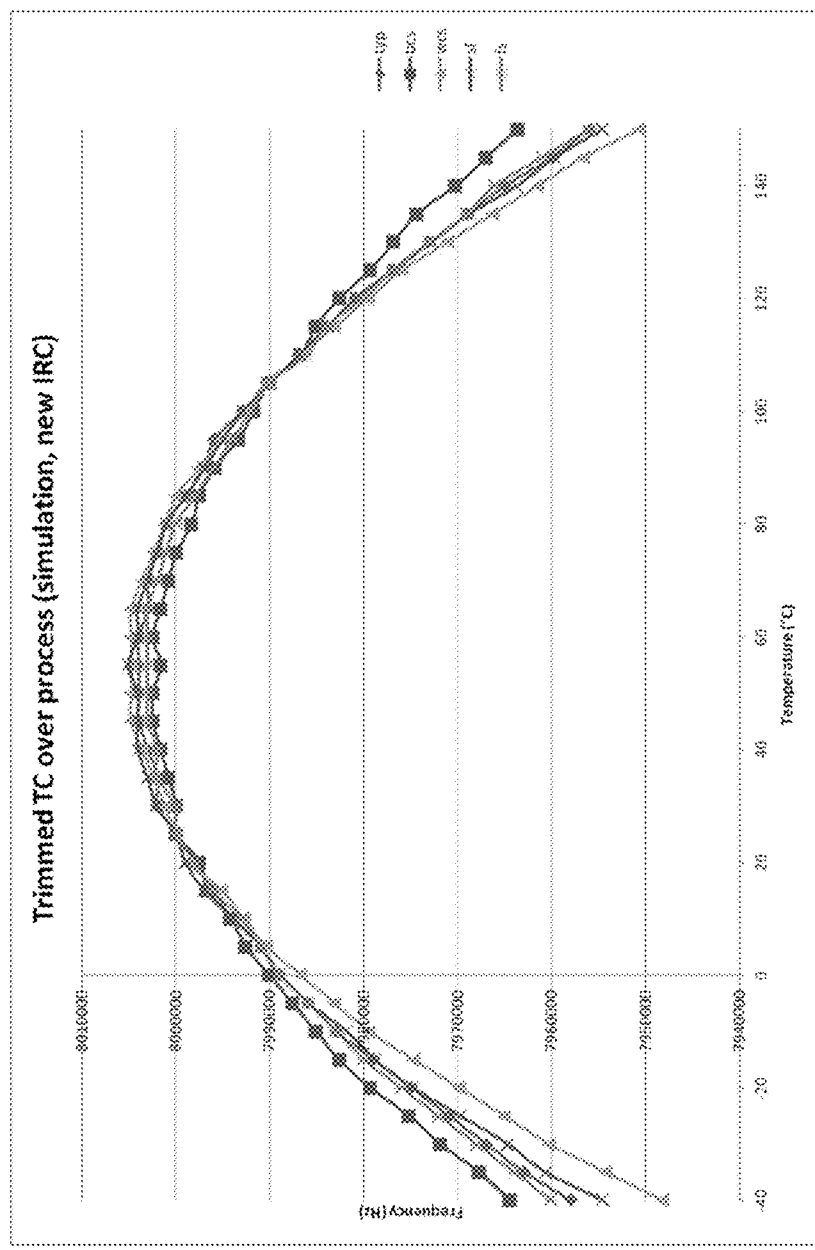
FIG. 6 illustrates an example of the frequency/temperature profiles for oscillator circuits within multiple different integrated circuit devices statically calibrated in accordance with examples of the present invention.

FIG. 6 illustrates an example of the frequency/temperature profiles for oscillator circuits 100 within multiple different integrated circuit devices that have been statically calibrated in accordance with the present invention such that a substantially symmetrical frequency/temperature profile for each oscillator circuit 100 is achieved. As can be seen in FIG. 6, over a desired operating temperature range of, say, −40° C. to +150° C., the frequency/temperature profiles for the oscillator circuits 100 within the various integrated circuit devices are substantially the same. In the example illustrated in FIG. 6, a maximum (worst case scenario) frequency/temperature profile variation over a required temperature range is 0.7% (min to max frequency), whilst a minimum (best case scenario) frequency/temperature profile variation over a required temperature range is 0.5% (min to max frequency). Thus, the maximum frequency/temperature profile variation across different devices is 0.2% (or +/−0.1%). Such a +/−0.1% variation over process is considered as an acceptable variation.

Figure 7:
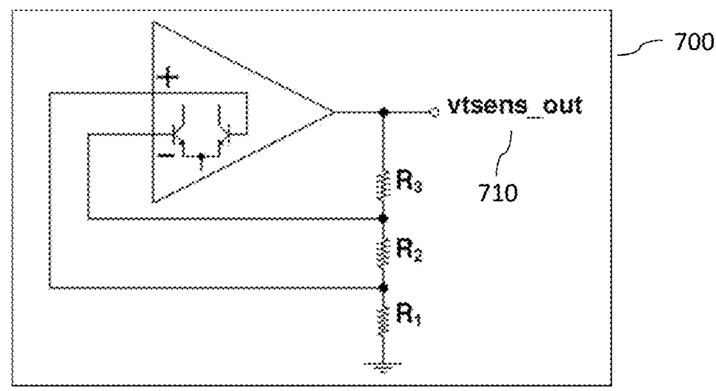
FIG. 7 illustrates a simplified circuit diagram of an example of a ΔVbe temperature sensor.

Since all parts have substantially the same frequency/temperature profile (+/−0.1%) after static calibration as described above, the relationship frequency=f(temperature) does not have to be determined (and stored) for individual parts, allowing a standardized relationship to be used during dynamic temperature compensation. In particular, it is contemplated that a temperature indication for the oscillator circuit 100 may be used to dynamically adjust an oscillating frequency of the oscillator circuit 100. For example, a temperature sensor, such as the ΔVbe temperature sensor 700 illustrated in FIG. 7, may be used to generate a temperature signal 710 comprising a temperature indication for the oscillator circuit 100. The temperature signal 710 may be provided to one or more dynamic temperature compensation components of the oscillator circuit 100 arranged to dynamically adjust at least one component of the oscillator circuit 100 based at least partly on the temperature indication provided by the temperature signal 710.

Figure 8:
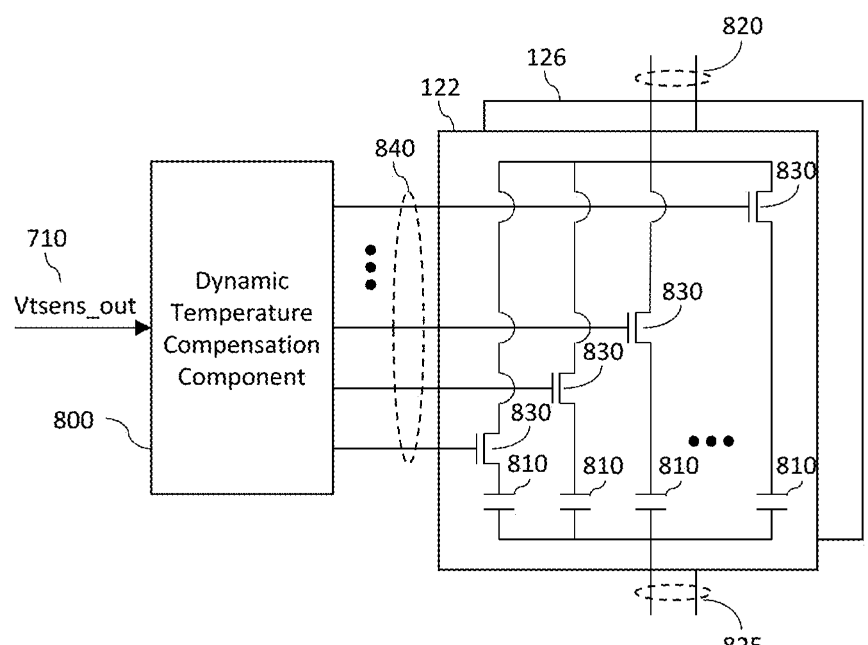
FIG. 8 illustrates a simplified block diagram of an example of a dynamic temperature compensation component.

FIG. 8 illustrates a simplified block diagram of an example of such a dynamic temperature compensation component 800. The dynamic temperature compensation component 800 is arranged to receive the temperature signal 710 comprising a temperature indication for the oscillator circuit 100. In the illustrated example, the temperature compensation component 800 is arranged to adjust the capacitive elements 122, 126 based at least partly on a received temperature indication and a standardized dynamic temperature compensation scheme (for example hardcoded into or otherwise configured within the temperature compensation component 800). In some examples, and as illustrated in FIG. 8, the capacitive elements 122, 126 of the oscillator circuit 100 may each comprise a dynamically configurable capacitor bank comprising a plurality of capacitive elements 810 operably coupled in parallel between an input 820 of the capacitive bank and an output 825 of the capacitive bank. At least a subset of the capacitive elements 810 are operably coupled in series with switching elements 830. In the illustrated example, the switching elements 830 are controllable by way of control signals 840 output by the temperature compensation component 800. In this manner, the temperature compensation component 800 is able to selectively open and close the switching elements 830 to include or exclude the respective capacitive elements 810 from the combined capacitance provided by each capacitor bank, and thus to adjust the capacitance of the capacitive elements 122, 126.

In this manner, by adjusting the capacitive elements 122, 126 of the oscillator circuit 100 based at least partly on the received temperature signal 710, the temperature compensation component 800 is able to dynamically adjust the oscillating frequency of the oscillator circuit 100 to compensate for temperature changes, and thus to maintain a substantially stable output frequency of the oscillator circuit 100 over a temperature range.

Figure 9:
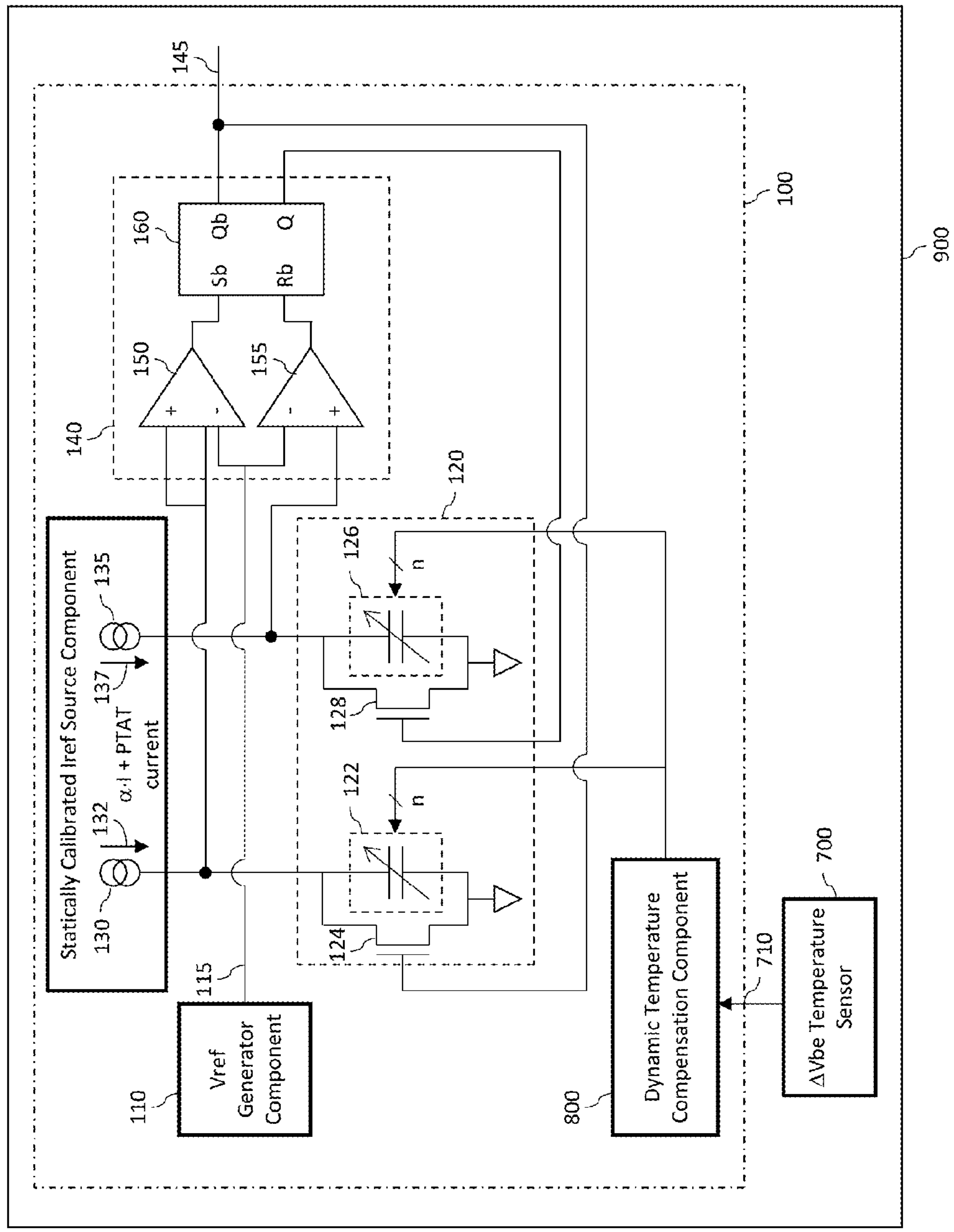
FIG. 9 illustrates a simplified circuit diagram of an alternative example of an oscillator circuit.

FIG. 9 illustrates a simplified block diagram of an example of an integrated circuit (IC) device 900 comprising an embedded oscillator circuit 100 according to some examples of the present invention. The oscillator circuit 100 comprises a reference voltage generator component 110 arranged to generate a reference voltage Vref 115. The oscillator circuit 100 further comprises an RC (resistance-capacitance) network sub-section 120. The RC network sub-section 120 comprises a first capacitive element 122 arrange to receive, and thereby be charged by, a first charging current Iref_1 132 from a first current source 130. Furthermore, the current sources 130, 135 are arranged to be statically calibrated to calibrate the oscillator circuit 100 to achieve a symmetrical frequency/temperature profile for the oscillator circuit 100.

The RC network sub-section 120 further comprises a first switching component 124 controllable to discharge the first capacitive element 122 there through. Additionally, the RC network sub-section 120 comprises a second capacitive element 126 arrange to receive, and thereby be charged by, a second charging current Iref_2 137 from a second current source 135. The RC network sub-section 120 further comprises a second switching component 128 controllable to discharge the second capacitive element 126 there through.

The oscillator circuit 100 further comprises an oscillator sub-section 140 arranged to generate an oscillating output 145. The oscillator sub-section 140 comprises a first comparator 150. A non-inverting input of the first comparator 150 is operably coupled between the first capacitive element 122 and the first current source 130. An inverting input of the first comparator 150 is operably coupled to the output of the reference voltage generator component 110. In the illustrated example, the first comparator 150 comprises an inverting output. In this manner, the first comparator 150 is arranged to compare the voltage across the first capacitive element 122 to the reference voltage 115, and to output a logical '0' value if the voltage across the first capacitive element 122 is greater than the reference voltage 115 and a logical '1' value if the voltage across the first capacitive element 122 is less than the reference voltage 115.

The oscillator sub-section 140 further comprises a second comparator 155. A non-inverting input of the second comparator 155 is operably coupled between the second capacitive element 126 and the second current source 135. An inverting input of the second comparator 155 is operably coupled to the output of the reference voltage generator component 110. In the illustrated example, the second comparator 155 comprises an inverting output. In this manner, the second comparator 155 is arranged to compare the voltage across the second capacitive element 122 to the reference voltage 115, and to output a logical '0' value if the voltage across the second capacitive element 126 is greater than the reference voltage 115 and a logical '1' value if the voltage across the second capacitive element 126 is less than the reference voltage 115.

The oscillator sub-section 140 further comprises an S/R flip-flop 160. A first (set) input of the S/R flip-flop 160 is operably coupled to the output of the first comparator 150. A second (reset) input of the S/R flip-flop 160 is operably coupled to the output of the second comparator 155. In the illustrated example, the S/R flip-flop 160 comprises active low inputs. In this manner, upon a logical '0' value being received at the first (set) input thereof, the S/R flip-flop 160 is arranged to apply a logical '1' at an output Q thereof, and a logical '0' at a complimentary output Qb thereof. Conversely, upon a logical '0' value being received at the second (reset) input of the S/R flip-flop 160, the S/R flip-flop 160 is arranged to apply a logical '0' at the output Q thereof, and a logical '1' at the complementary output Qb thereof. The complementary output Qb of the S/R flip-flop 160 is operably coupled to the first switching element 124 and arranged to control the first switching element 124 to discharge the first capacitive element 122 when a logical '1' is applied to the complementary output Qb of the S/R flip-flop 160. Similarly, the output Q of the S/R flip-flop 160 is operably coupled to the second switching element 128 and arranged to control the second switching element 128 to discharge the second capacitive element 126 when a logical '1' is applied to the output Q of the S/R flip-flop 160. In this manner, the switching elements 124, 128 are caused to charge and discharge their respective capacitive elements 122, 126 in an opposing manner, triggering the comparators 150, 155 to output signals that toggle the S/R flip-flop 160 in an oscillating manner. The oscillating frequency of the oscillator circuit 100 is dependent on the rates at which the capacitive elements 122, 126 are charged and discharged and the reference voltage 115. The rates at which the capacitive elements 122, 126 are charged and discharged are proportional to the reference voltage Vref 115, the capacitive values of the capacitive elements 122, 126, the resistive characteristics of the switching elements 124, 128 when switched on, and the charging currents 132, 137.

In the illustrated example, the capacitive elements 122, 126 comprise dynamically adjustable capacitive elements, such as the dynamically configurable capacitor banks illustrated in FIG. 8. The oscillator circuit 100 illustrated in FIG. 9 further comprises a temperature compensation component 800. The temperature compensation component 800 is arranged to receive a temperature signal 710 from a temperature sensor 700 of the IC device 900 comprising a temperature indication for the oscillator circuit 100. In the illustrated example, the temperature compensation component 800 is arranged to adjust the capacitive elements 122, 126 based at least partly on the received temperature indication provided by the temperature signal 710 and a standardized dynamic temperature compensation scheme (for example hardcoded into or otherwise configured within the temperature compensation component 800).

Thus, the embedded oscillator circuit 100 in the example illustrated in FIG. 9 comprises current source components 130, 135 arranged to be statically calibrated to calibrate the oscillator circuit 100 to achieve a symmetrical frequency/temperature profile for the oscillator circuit 100. The oscillator circuit 100 further comprises capacitive elements 122, 126 arranged to be dynamically calibrated to enable an oscillating frequency of the oscillator circuit 100 to be dynamically adjusted, and a temperature compensation component 800 arranged to receive at least one temperature indication 710 for the oscillator circuit 100 and to dynamically adjust the capacitive elements 122, 126 based at least partly on the at least one received temperature indication.

It will be appreciated that the present invention is not limited to the dynamic temperature compensation of the oscillator circuit 100 being implemented by way of adjusting the capacitance of the capacitive elements 122, 126 within the RC network of the oscillator circuit, and it is contemplated that other techniques for dynamically adjust the oscillating frequency of the oscillator circuit 100 to compensate for temperature changes to maintain a substantially stable output frequency of the oscillator circuit 100 over a temperature range may alternatively be implemented. For example, such alternative techniques may comprise, say, adjusting the resistance of the resistive elements within the RC network of the oscillator circuit, adding a portion of PTAT current into the resistor network generating the reference voltage Vref 115, etc.

Figure 10:
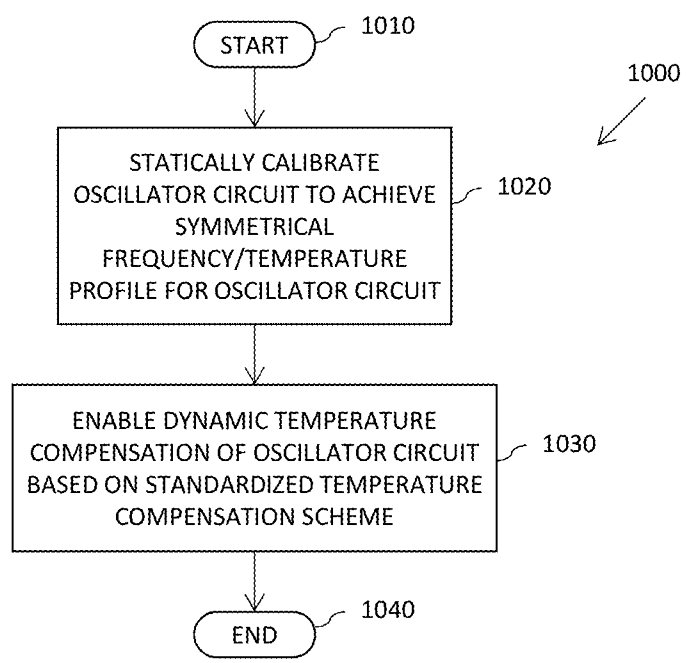
FIG. 10 illustrates a simplified flowchart of an example of providing temperature compensation for an output frequency of an embedded oscillator circuit.

Referring now to FIG. 10, there is illustrated a simplified flowchart 1000 of an example of providing temperature compensation for an output frequency of an embedded oscillator circuit, such as may be implemented within the oscillator circuits 100 of FIGS. 1 and 9. The method starts at 1010 and moves on to 1020 where the oscillator circuit is statically calibrated to achieve a symmetrical frequency/temperature profile therefor. Next, at 1030, dynamic temperature compensation of the oscillator circuit based on a standardized temperature compensation scheme is enabled. The method then ends, at 1040.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof such as the dynamic temperature compensation component 800, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An oscillator circuit comprising:

at least a first component arranged to be statically calibrated to calibrate the oscillator circuit to achieve a symmetrical frequency/temperature profile for the oscillator circuit, wherein the at least the first component is statically calibrated in response to an adjustment of the at least the first component made during production of the oscillator circuit;

at least one further component arranged to be dynamically calibrated to enable an oscillating frequency of the oscillator circuit to be dynamically adjusted; and at least one temperature compensation component arranged to receive at least one temperature indication for the oscillator circuit and to dynamically adjust the at least one further component based at least partly on the at least one received temperature indication.

2. The oscillator circuit of claim 1, wherein the at least one temperature compensation component is arranged to dynamically adjust the at least one further component based on a standardized temperature compensation scheme.

3. The oscillator circuit of claim 1, wherein the at least first component is arranged to be statically calibrated to calibrate the oscillator circuit to achieve a symmetrical parabolic frequency/temperature profile for the oscillator circuit.

4. The oscillator circuit of claim 1, wherein the at least first component comprises at least one current source for generating at least a part of a charging current for charging at least one capacitive element within an RC network of the oscillator circuit.

5. The oscillator circuit of claim 4, wherein the at least first component comprises a current source component arranged to provide a Proportional To Absolute Temperature, PTAT, current component of the charging current.

6. The oscillator circuit of claim 1, wherein the at least first component is statically calibrated to equalise oscillating frequencies of the oscillator circuit at coldest and hottest coldest and hottest temperatures within a temperature range.

7. The oscillator circuit of claim 1, wherein the at least one further component arranged to be dynamically calibrated comprises at least one capacitive element within an RC network of the oscillator circuit.

8. The oscillator circuit of claim 1 implemented within an integrated circuit device comprising at least one die within a single integrated circuit package.

9. A method of providing temperature compensation for an output frequency of an embedded oscillator circuit, the method comprising:

statically calibrating a first component of a first component of the oscillator circuit to achieve a symmetrical frequency/temperature profile therefor, wherein statically calibrating the first component is an adjustment of the first component made during production of the oscillator circuit; and enabling dynamic temperature compensation of the oscillator circuit based on a standardized temperature compensation scheme.

10. The method of claim 9, wherein the method comprises statically calibrating the oscillator circuit to achieve a symmetrical parabolic frequency/temperature profile for the oscillator circuit.

11. The oscillator circuit of claim 2, wherein the at least first component is arranged to be statically calibrated to calibrate the oscillator circuit to achieve a symmetrical parabolic frequency/temperature profile for the oscillator circuit.

12. The oscillator circuit of claim 2, wherein the at least first component comprises at least one current source for generating at least a part of a charging current for charging at least one capacitive element within an RC network of the oscillator circuit.

13. The oscillator circuit of claim 3, wherein the at least first component comprises at least one current source for generating at least a part of a charging current for charging at least one capacitive element within an RC network of the oscillator circuit.

14. The oscillator circuit of claim 1, wherein the oscillator is statically calibrated during production testing.

15. The oscillator circuit of claim 1, wherein signals described in positive logic are implemented in negative logic, and the signals described in negative logic are implemented as positive logic.

16. The oscillator circuit of claim 1, wherein portions of the oscillator are described in a hardware description language.

17. The oscillator circuit of claim 1, wherein portions of desired device functions are implemented in computer code on a computer system.

18. The method of claim 9, further comprising using a temperature sensor to develop a temperature signal, and conveying the temperature signal to the dynamic temperature compensation scheme.

19. A method of providing temperature compensation for an output frequency of an embedded oscillator circuit, the method comprising:

statically calibrating a first component of the oscillator circuit to achieve a symmetrical frequency/temperature profile therefor, wherein the statically calibrating is an adjustment of the first component made during production of the oscillator circuit;

dynamically calibrating a second component to enable an oscillating frequency of the oscillator circuit to be dynamically adjusted; and receiving a temperature indication for the oscillator circuit and dynamically adjusting the second component based at least partly on the received temperature indication.

20. The method of claim 19, further comprising using a temperature sensor to develop a temperature signal, and conveying the temperature signal to the second component.

* * * * *